United States Patent
Sung

[19]

[11] Patent Number: 5,808,335
[45] Date of Patent: Sep. 15, 1998

[54] REDUCED MASK DRAM PROCESS

[75] Inventor: Janmye Sung, Tauyuan, Taiwan

[73] Assignee: Vanguard International Semiconductor Corporation, Hsin-Chu, Taiwan

[21] Appl. No.: 892,334

[22] Filed: Jul. 14, 1997

Related U.S. Application Data

[63] Continuation of Ser. No. 663,444, Jun. 13, 1996, abandoned.

[51] Int. Cl.$^6$ .................................................. H01L 27/108
[52] U.S. Cl. ........................... 257/306; 257/762; 257/763
[58] Field of Search ................................... 257/306, 303, 257/762, 763, 765, 908

[56] References Cited

U.S. PATENT DOCUMENTS

| | | | |
|---|---|---|---|
| 4,404,733 | 9/1983 | Sasaki ........................................ | 257/344 |
| 4,623,912 | 11/1986 | Chang et al. ............................. | 257/411 |
| 5,017,982 | 5/1991 | Kobayashi ................................ | 257/306 |
| 5,089,868 | 2/1992 | Motonami ................................ | 257/303 |
| 5,134,085 | 7/1992 | Gilgen et al. .............................. | 437/52 |
| 5,196,910 | 3/1993 | Moriuchi et al. ........................ | 357/23.6 |
| 5,304,828 | 4/1994 | Kim et al. ................................. | 257/309 |
| 5,323,343 | 6/1994 | Ogoh et al. .............................. | 365/149 |
| 5,331,191 | 7/1994 | Sugiura et al. .......................... | 257/336 |
| 5,592,673 | 1/1997 | Chao et al. ............................... | 437/192 |

OTHER PUBLICATIONS

Sze, S. M., Semiconductor Devices: Physics and Technology, John Wiley and Sons, pp. 360–361, 1985.

*Primary Examiner*—Sara W. Crane
*Attorney, Agent, or Firm*—George O. Saile; Stephen B. Ackerman

[57] ABSTRACT

A DRAM device structure, using a stacked capacitor configuration, has been developed. The stacked capacitor structure is comprised of a lower, polysilicon storage node, a thin composite dielectric layer, and an overlying capacitor plate, comprised of a composite layer of an overlying polysilicon layer, on a thin amorphous silicon layer, contacting an N type source and drain region, in a semiconductor substrate. A bit line contact structure, comprised of a metal silicide - polysilicon composite structure, is also used in the DRAM device structure. A PFET device, adjacent to the stacked capacitor DRAM device, featuring a two part contact structure, to P type source and drain regions, comprised of a wide top, aluminum - copper shape, overlying a narrower tungsten stud, is also used in this invention.

1 Claim, 8 Drawing Sheets

REDUCED MASK DRAM PROCESS

This application is a continuation of Ser. No. 08/663,444, filed Jun. 13, 1996, now abandoned.

BACKGROUND OF THE INVENTION (1) Field of the Invention

The present invention relates to semiconductor devices, and more specifically to a process for fabricating high density, dynamic random access memory, (DRAM), devices.

(2) Description of the Prior Art

The major objective of the semiconductor industry, in producing DRAM devices, is to continually increase the density of the DRAM product, while still maintaining, or lowering the cost of these specific devices. The basic DRAM memory cell is usually comprised of a transfer gate transistor and a connected capacitor. Charges are stored in the capacitor section of the DRAM, and are accessed via the transfer gate transistor. The ability to densely pack storage cells, while still maintaining sufficient stored charge, is a function of the type and structure of the capacitor section of the DRAM. Two iterations of capacitors are presently being manufactured. A trench capacitors in which charge is stored vertically in a structure fabricated by etching a deep trench in a substrate, has found use where high DRAM densities are desired. This type of capacitors although eventually needed for the higher density DRAMS, is however costly to fabricate, regarding the trench etching, trench filling and planarization processing. A second type of capacitor used in the DRAM technology is the stacked capacitor cell, (STC). In this design two conductive layers, such as polycrystalline silicon, are placed over a section of the transfer gate transistor, with a dielectric layer sandwiched between the polycrystalline layers. The STC iteration has been used extensively in the industry, with emphasis placed on reducing the cost, while still increasing DRAM chip densities.

In order to successfully increase DRAM densities efforts have been directed to reducing specific device geometries. This has been accomplished via advances in the photolithographic discipline, where more sophisticated exposure cameras, as well as the development of more sensitive photoresist materials, have allowed sub-micron chip features to be routinely achieved. Other semiconductor device fabrication disciplines, such as reactive ion etching, (RIE), as well as ion implantation, (I/I), and low pressure chemical vapor deposition, (LPCVD), have also contributed to the successful objective of decreasing specific device geometries. However with the trend to more sophisticated semiconductor equipment and processes, the ability to maintain or reduce cost becomes more difficult.

The objective of cost reduction has been addressed by the DRAM industry in the form of mask reduction. That is attempting to fabricate the desired DRAM design, while using fewer, costly photolithographic steps. Gilgen, et al, in U.S. Pat. No. 5,134,085, describe a DRAM process in which significant reductions in photomasking steps have occurred. However they still show a "split polysilicon" process, in which the polysilicon used for the gate structure for P channel devices, is patterned using one photo step, while another photo step is needed to pattern the capacitor plate for the STC structure. This step occurred after fabrication of the polysilicon gates used for the N channel devices. The ability to fabricate the gate structures at different points of the process allowed for the creation of the lightly doped, as well as the more highly doped, source and drain regions to be obtained without the use of photolithographic processing, thus reducing the cost of the DRAM chip. This patent, though partially successful in reducing photomasking steps compromises P channel performance by an intentional undercut of the polysilicon gate structure, designed to reduce source to gate overlap capacitance. However this undercut increases resistance and decreases the performance of the P channel device.

This invention will describe a DRAM process with a significant reduction in photolithographic steps, while still maintaining superior P channel performance. In addition this invention will describe a fabrication method used to obtain self aligned bit line, and storage node contacts, offering performance improvements.

SUMMARY OF THE INVENTION

It is an object of this invention to provide a process for fabricating stacked capacitor, dynamic random access memory, (DRAM), devices, on a semiconductor substrate.

It is another object of this invention to use a split polysilicon process to reduce the total number of photolithographic masking steps, eliminating the lightly doped source and drain, and the n+ and p+ source and drain photomasking steps.

It is still another object of this invention to use the same photo step to perform the N channel to N channel isolation ion implantation step, while also adjusting the threshold voltage for the core memory N channel devices.

It is yet another object of this invention to fabricate the P channel gate structure and the capacitor plate using the same photo step.

It is still yet another object of this invention to use a self aligned bit contact structure, and a self aligned storage node structure, to improve device performance, with the bit line formation being performed either before or after the capacitor plate formation.

It is still yet another object of this invention to use a thin silicon nitride layer between interlevel dielectric layer 2, and second level metal, to improve yield and reliability of the DRAM device.

In accordance with this present invention a method is described for fabricating stacked capacitor, DRAM devices. A self aligned, twin, N well and P well, is formed via ion implantations and driven in. Thick field oxide is grown to isolate the N well region from the P well region, followed by a blanket ion implantation step, performed for purposes of subsequently adjusting the threshold voltage of the N channel device. A core memory, N channel, threshold adjust ion implant is next performed to the opened P well region, which also serves a role in improving the N channel to N channel isolation. After photoresist removal and careful cleans, a gate oxide is grown followed by deposition and doping of a polysilicon layer. After a thin oxide growth, on the polysilicon layer, a layer of phosphosilciate glass, (PSG), is deposited followed by photoresist patterning and a reactive ion etch, (RIE), step, resulting in the formation of N channel, polysilicon gate structures, on the P well region, while the photoresist masking of the N well region, results in undisturbed blanket PSG -polysilicon layers. The lightly doped source and drain, (LDD), regions are then formed for the N channel devices by blanket ion implant, followed by deposition and blanket RIE to produce insulator spacers on the N channel polysilicon gate structures. The N channel source and drains are then formed, again using blanket ion implantation procedures.

Next the storage node structure is formed by; deposition of an insulator, masking to open the insulator in regions where the storage node contact is to be formed, deposition of the storage node polysilicon layer, masking and RIE to form the storage node contact structure in P well region. A thin composite dielectric, and a thin layer of amorphous silicon is next deposited, followed by photoresist masking and removal of the composite dielectric and amorphous silicon layers, in the N well region. The PSG layer is then removed from the blanket polysilicon layer, in the N well region, followed by another deposition of polysilicon and insulator. Photoresist and RIE processing are next performed to create the storage polysilicon of the capacitor structure, for the N channel region, while the same RIE process creates the P channel polysilicon gate structure in the N well region. A P channel LDD ion implant process, followed by the creation of an insulator spacer and the P channel source and drain regions, are next performed.

The bit line contact hole process is next performed by first depositing an insulator film, and then using photoresist and RIE processes to create the bit contact hole to the N+ source and drain areas in the P well regions. Bit line blanket metallization, followed by patterning using photoresist and RIE, are used to form the bit line contact structure. It should be noted that the bit line structure can be created before the storage node structure if desired.

A first interlevel dielectric is then deposited and planarized using chemical mechanical polishing, (CMP), followed by contact hole openings to the P channel source and drain regions. After contact metallization, and the formation of a first metal structure, a second interlevel dielectric is deposited, and planarized using CMP processing. A thin silicon nitride layer is next deposited, followed by via hole openings, and metal deposition and patterning to create the second metal structure. Finally passivation, in the form of a thin insulator and polyimide, overly the second metal structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming stacked capacitor, DRAM, devices, will now be covered in detail. The DRAM device is fabricated using a complimentary metal oxide, (CMOS), field effect transistor approach. That is that both N type, field effect transistors, (NFET), as well as P type, field effect transistors, (PFET), are used on the same chip. The CMOS technology, used to fabricate the stacked capacitor DRAM devices described in this invention, is now being manufactured in industry, therefore only the specific areas unique to understanding this invention will be described in detail.

Figure 1:
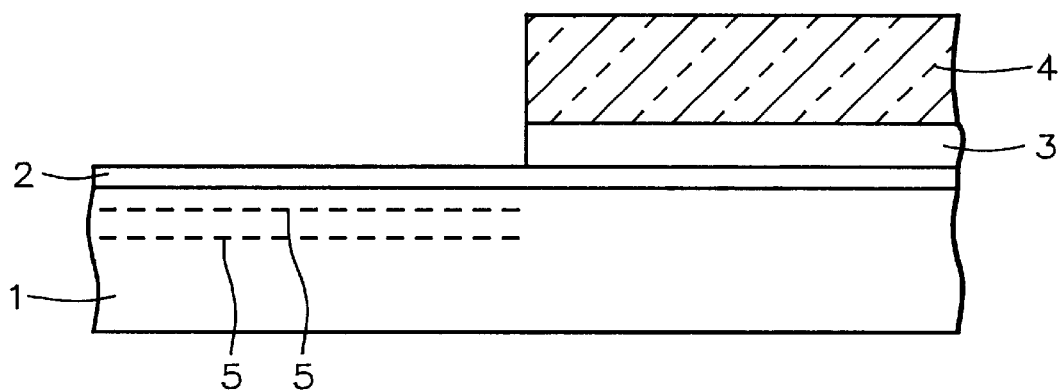
FIGS. 1–4, which schematically, in cross-sectional representation, describe the formation of the P and N well, as well as the isolation regions.
Figure 2:
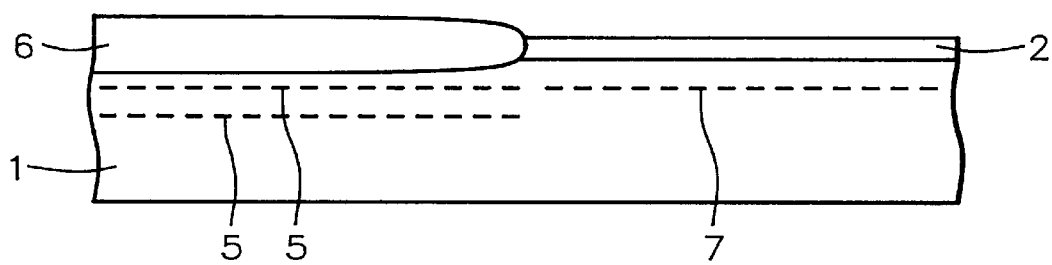
Figure 3:
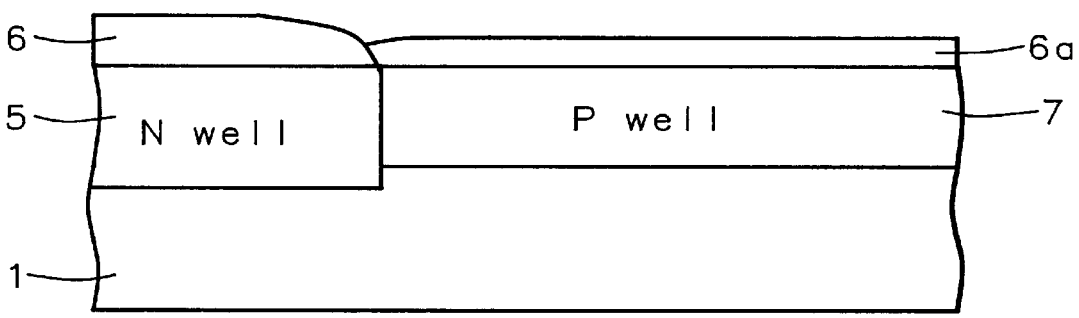

FIG. 1 shows a starting substrate, 1, composed of P type, single crystal silicon with a <100> orientation. A silicon oxide layer, 2, is grown at a temperature between about 800° to 1100° C., to a thickness between about 150 to 550 Angstroms, followed by a low pressure chemical vapor deposition, (LPCVD), of silicon nitride, 3, at a temperature between about 600° to 800° C., to a thickness between about 600 to 1500 Angstroms. A photoresist layer, 4, is used as a mask to allow removal of silicon nitride layer, 3, from the area of the substrate, that will be used for the N well region. The silicon nitride is removed using reactive ion etching, (RIE). The dopants needed to form the N well region, 5, are now supplied via ion implantation of arsenic, at an energy between about 50 to 180 Kev., and at a dose between about 1E11 to 1E13 atoms/cm2, and phosphorous, at an energy between about 100 to 400 Kev., at a dose between about 1E11 to 1E13 atoms/cm2. After photoresist removal, using oxygen plasma ashing, followed by careful wet chemical cleans, an oxidation is performed to result in a silicon dioxide layer, 6, between about 1500 to 2500 Angstroms, in region 5. The silicon nitride layer, 3, is then removed, using a hot phosphoric acid solution. This is schematically shown in FIG. 2. Also shown in FIG. 2 is the result of a ion implantation of boron, 7, or BF2, used for forming the P well region. The implant step is performed at an energy between about 10 to 100 Kev., at a dose between about 1E12 to 1E13 atoms/cm2. FIG. 3, shows the result of a drive-in, performed at a temperature between about 1025° to 1075° C., for a time between about 30 to 90 min., followed by an additional drive-in at a temperature between about 1125° to 1175° C., for a time between about 10 to 120 min. The drive-in results in the formation of P well region, 7, N well region, 5, as well as a growth of a silicon oxide layer 6a, on the surface of the P well region.

Figure 4:
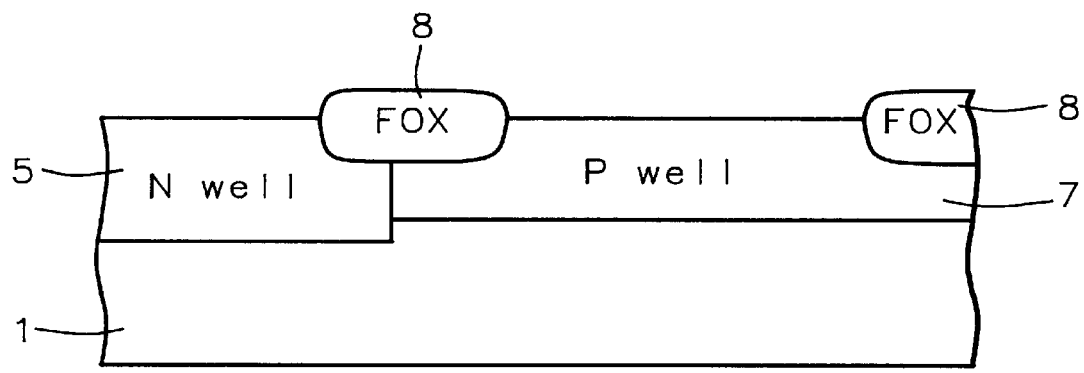
Figure 5:
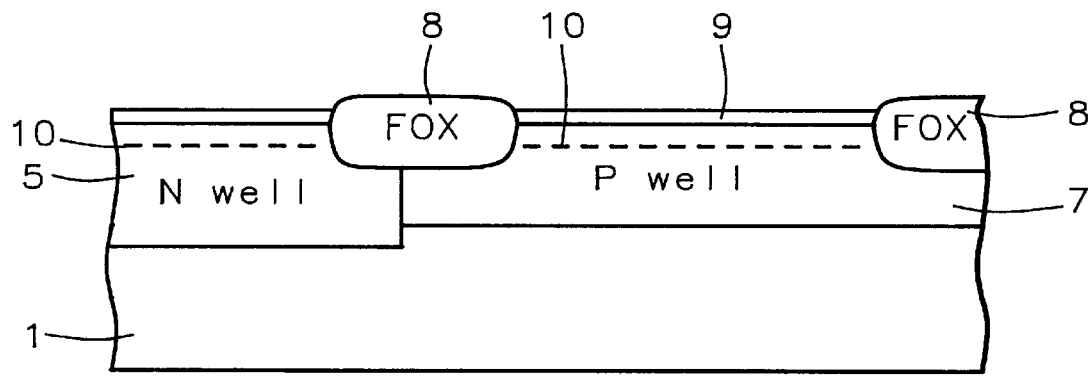
FIGS. 5–9, which schematically, in cross-sectional style, describe the formation of the N channel polysilicon gate structure.
Figure 6:
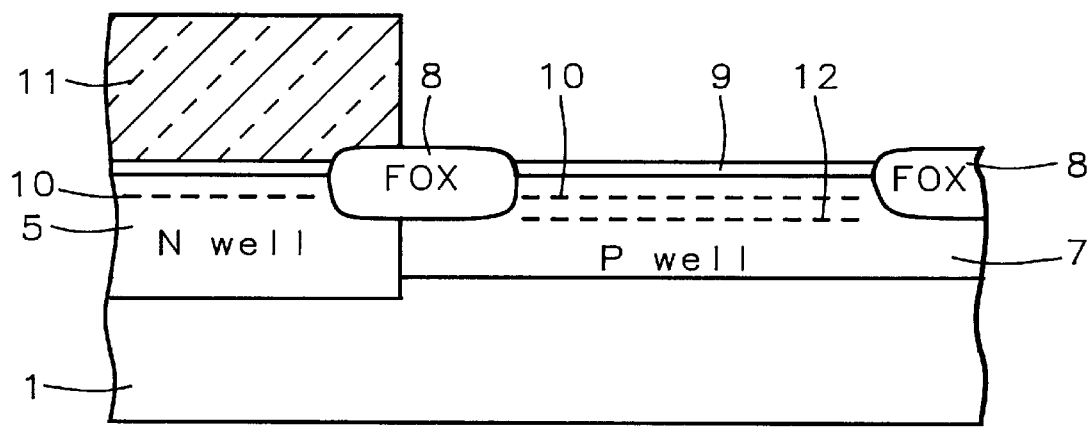

After removal of oxide layer, 6, and oxide layer 6a, via use a bufferd hydrofluoric acid solution, conventional isolation processing is applied to achieve the field oxide (FOX), region, 8, illustrated in FIG. 4. Briefly the method used to form the FOX insulator is to use a thin thermal oxide, and a silicon nitride layer, as an oxidation mask. The desired FOX regions are etched open in the silicon nitride - silicon dioxide mask using conventional photolithographic techniques and dry etching processing. After removal of the masking photoresist, and a chemical clean, a FOX region is grown, typically to a thickness of about 4000 to 7000 Angstroms. After removal of the oxidation mask, via wet processes such as hot phosphoric acid for the silicon nitride layer, and a buffered hydrofluoric acid for the thin thermal oxide, another wet chemical clean is performed, followed by the formation of a screen oxide, 9, grown as thermally oxidized silicon, at a temperature between about 850° to 950° C., to a thickness between about 150 to 250 Angstroms. This can be seen in FIG. 5. A blanket ion implantation of BF2, 10, is then performed, for purposes of adjusting the threshold voltage of a N channel device, (and/or the P channel device) that will be fabricated in the P well region. The implantation is performed at an energy between about 20 to 60 Kev., at a dose between about 1E11 to 1E12 atoms/cm2. An additional ion implantation step is next performed to adjust the N channel core memory, if two different threshold voltages for N channel devices is needed in a specific design. This step is only applied to the N channel region, so photoresist masking, 11, is used to block the N well region from a implantation, 12, of BF2, at an energy between about 20 to 60 Kev., at a dose between about 1E11 to 1E12 atoms/cm2. This is shown in FIG. 6.

Figure 7:
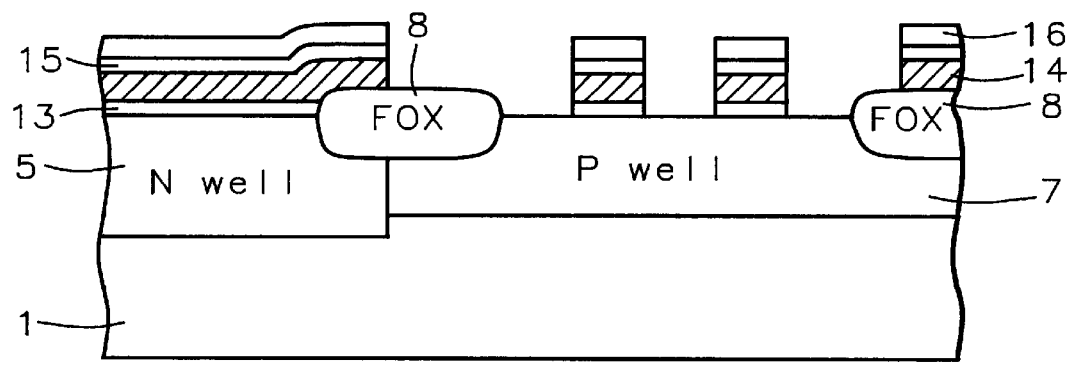
Figure 8:
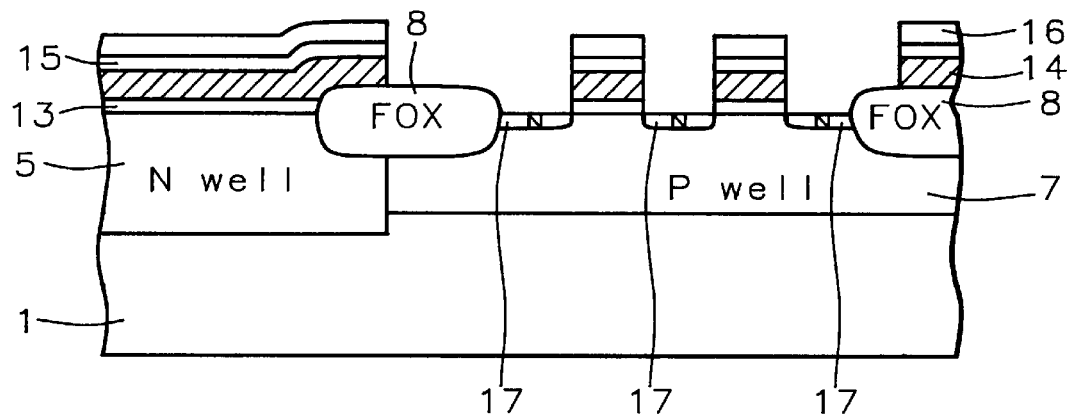
Figure 9:
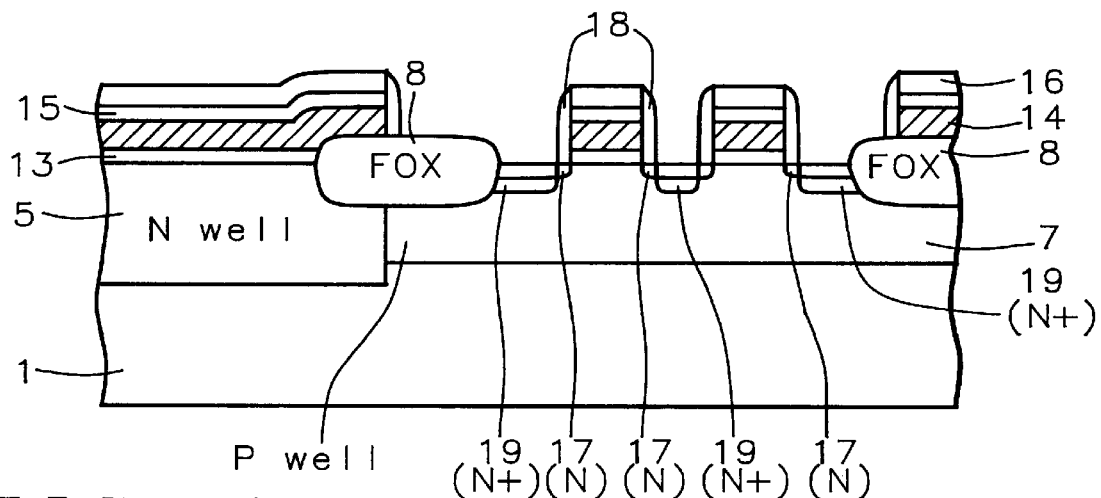

After photoresist removal, using a oxygen plasma ash, followed by screen oxide removal, via a buffered hydrofluoric acid solution, and careful chemical cleans, a gate oxide, 13, is thermally grown at a temperature between about 850° to 900° C., to a thickness between about 60 to 200 Angstroms. A polysilicon layer, 14, is then grown via LPCVD processing, using in-situ doping using PH3, at a temperature between about 550° to 650° C., to a thickness between about 1000 to 4000 Angstroms. A thin silicon dioxide layer, 15, is thermally grown at a temperature between about 800° to 900° C., to a thickness between 30 to 60 Angstroms, followed by a phosphosilicate, (PSG), deposition, using LPCVD processing, at a temperature between about 600° to 800° C., to a thickness between about 1500 to 2500 Angstroms, with the PSG layer, 16, containing between about 2 to 6% P2O5. Patterning of the polysilicon gate structure, used for the N channel devices, is next performed using conventional photoresist techniques, and RIE, using CHF3 for the insulator material, while Cl2 or HBr is used to pattern the polysilicon material. After photoresist removal, the resulting structures can be seen in FIG. 7. It should be noted that the polysilicon gate structures, to be used for the P channel devices, have not yet been formed. This aspect of the split polysilicon gate process, will allow source and drain processing, for both N channel as well as P channel devices, to be performed without costly photoresist masking procedures. FIGS. 8–9, schematically describe the processing used to create the lightly doped, (LDD), and standard source and drain regions. First a phosphorous ion implant, at an energy between about 30 to 70 Kev., at a dose between about 1E13 to 1E14 atoms/cm2, is used to create LDD areas, 17, in the P well region, 7. It can be seen that photoresist masking was not needed since the silicon to be used for the P channel devices, in the N well region, 5, is protected from the implant process by PSG and polysilicon layers. An LPCVD deposition of silicon oxide, using tetraethylorthosilicate, (TEOS), as a source material, is performed to a thickness between about 1000 to 3000 Angstroms, followed by a blanket anisotropic RIE procedure, using CHF3, to form insulator spacer, 18. Another ion implant procedure, again performed without photoresist masking, is carried out using arsenic, and/or phosphorous, at an energy between about 30 to 100 Kev., at a dose between about 1E15 to 5E15 atoms/cm2, to create N+source and drain area 19, in the P well region.

Figure 10:
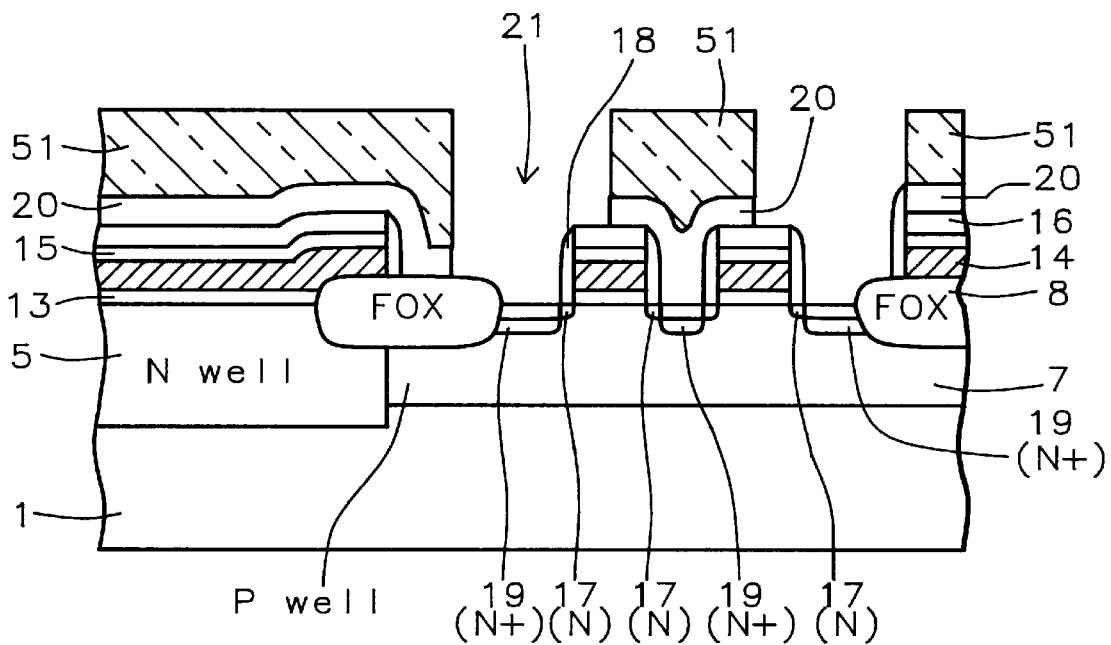
FIGS. 10–11, which again in cross-sectional style, schematically show the formation of the storage node.
Figure 11:
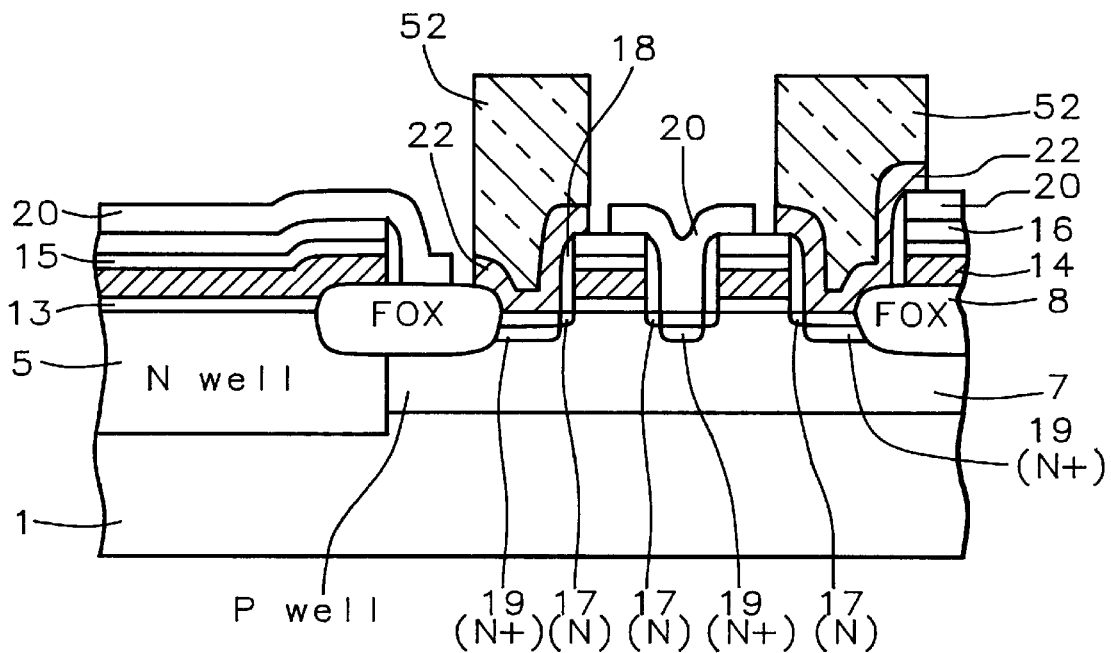
Figure 12:
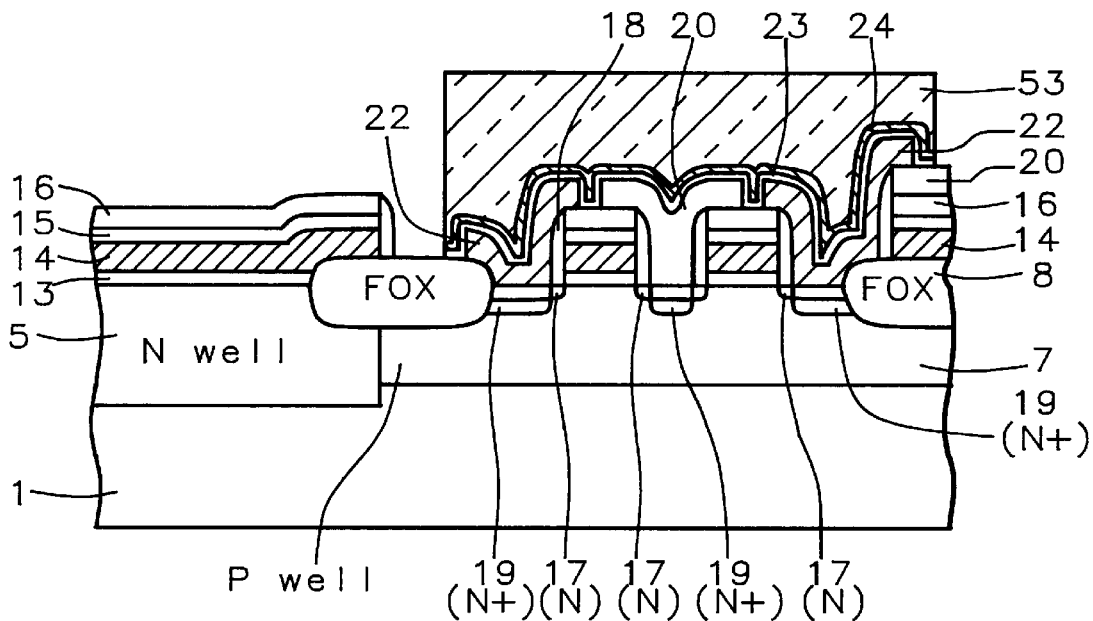
FIGS. 12–15, which schematically in cross-sectional representation, shows the formation of the P channel capacitor plate, as well as the formation of the P channel polysilicon gate structure.

The storage node contact hole etch process is next addressed. A thin layer of TEOS insulator, 20, is deposited using LPCVD techniques to a thickness between about 750 to 2500 Angstroms. A critical photoresist image, 51, is applied to open area, 21, in the P well region, shown in FIG. 10. This is accomplished with RIE processing using CHF3. It can be seen that opening 21, will allow self-aligned storage node contact to be achieved. After photoresist removal, via oxygen plasma ashing followed by careful wet cleans, another layer of polysilicon, 22, is grown using LPCVD, using an undoped layer of a thickness between about 1000 to 3500 Angstroms, followed by an PH3 in-situ doped layer, a thickness between about 1500 to 3500 Angstroms. The polysilicon is then patterned using standard photoresist images, 52, and RIE processing using SF6 and Cl2, to produce the storage node contact, 22, self aligned to the adjacent polysilicon gate structure, 14. This can be seen in FIG. 11. After photoresist removal, again using an O2 plasma ash, and careful wet cleans, an interlevel dielectric, 23, is created. This insulator, made of silicon Oxide -silicon Nitride - silicon Oxynitride, is referred to as ONO. It is obtained by first thermal oxidation of polysilicon layer, 22, at a temperature between about 850° to 950° C., to a thickness between about 40 to 80 Angstroms. Next a thin layer of silicon nitride is grown using LPCVD, at a temperature between about 700° to 800° C., to a thickness between about 50 to 100 Angstroms. Finally an oxidation at a temperature between about 900° to 950° C., is performed to convert a portion of the silicon nitride layer to silicon oxynitride. A thin layer of amorphous silicon, 24, is then deposited at a temperature between about 525° to 575° C., to a thickness between about 300 to 700 Angstroms, using LPCVD. Patterning of the composite amorphous Si, 24, - ONO, 23, - storage node contact dielectric mask, 20, is accomplished via standard photoresist, 53, and RIE processes, using CHF3, for the ONO layer, and SF6—Cl2, for the polysilicon films, and CHF3 again for removal of TEOS oxide layer, 20, in the N well region, 5. This is shown in FIG. 12.

Figure 13:
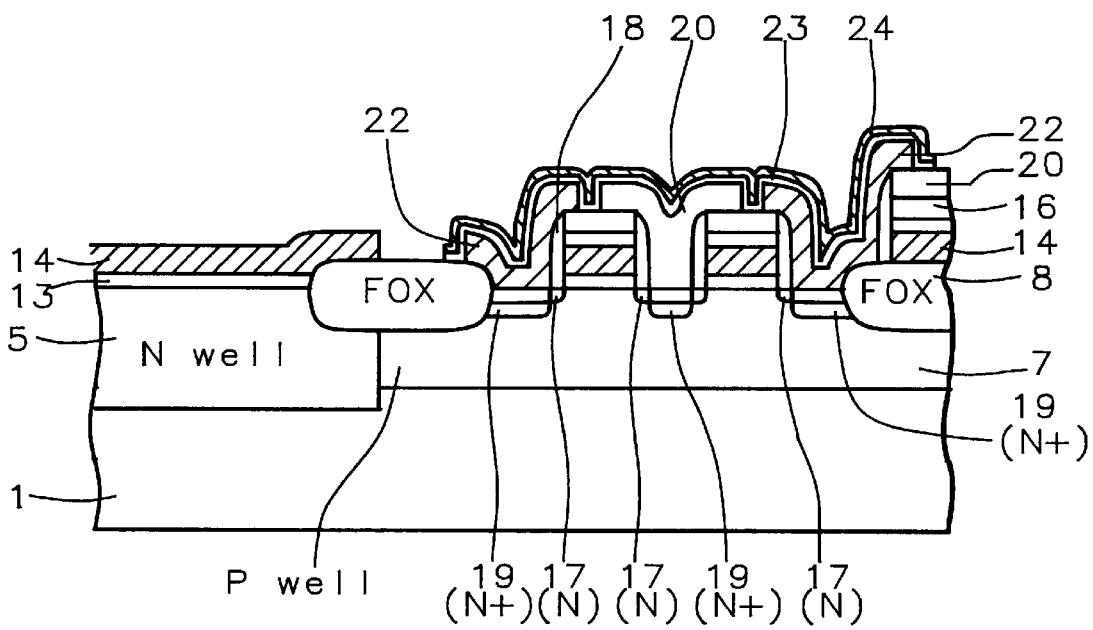
Figure 14:
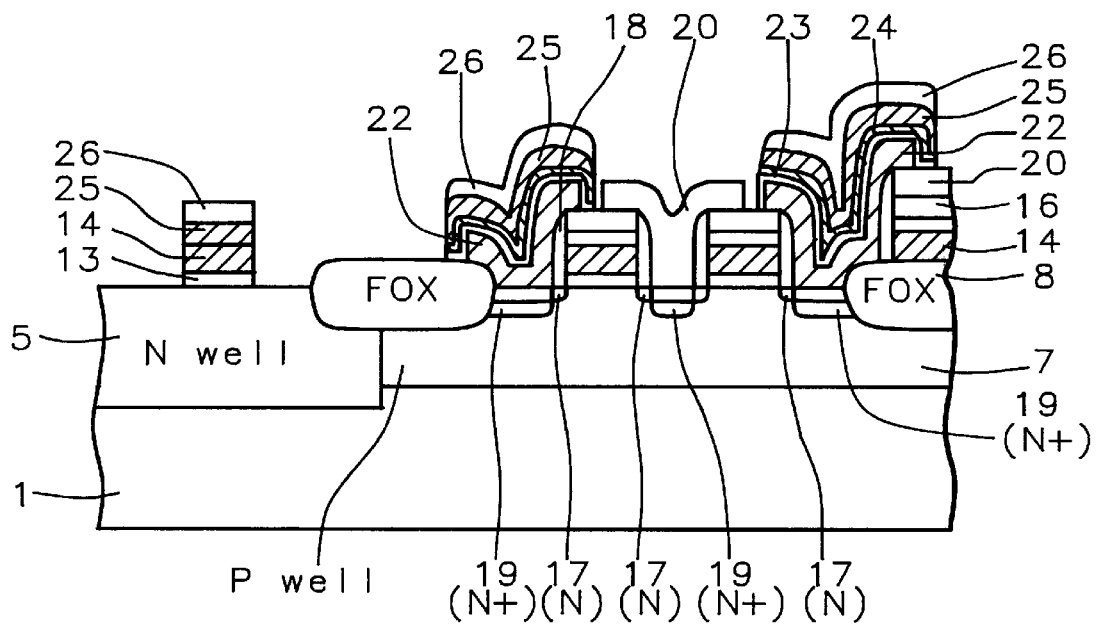

FIG. 13, shows the DRAM device after photoresist removal, again via O2 plasma ashing, a wet chemical clean, and the wet removal of PSG layer, 16, as well as the removal of oxide layer, 15, from polysilicon layer, 14, in the N well region, 5. The PSG removal was accomplished using ammonium peroxide, while oxide layer 15 was removed via use of dilute hydroflouric acid. Next a layer of polysilicon, 25, is grown using LPCVD, using in-situ doping processing, at a temperature between about 525° to 650° C., to a thickness between about 750 to 1250 Angstroms. A layer of TEOS deposited silicon oxide, 26, is deposited on polysilicon layer 25, at a temperature between about 525° to 625° C., to a thickness between about 500 to 1500 Angstroms, using LPCVD. Patterning is next performed to define the capacitor plate, in the P well region, 7, while the same patterning process results in the creation of the polysilicon gate structure, in the N well region, 5. The patterning is accomplished using standard photoresist procedures, followed by RIE using CHF3 for the TEOS insulator, 26, while SF6 and Cl2, or HBr were used to etch polysilicon layer, 25, for the capacitor plate structure, and an, overetch in SF6 and Cl2 allowed polysilicon layer 25, and polysilicon layer 14, to be patterned into the polysilicon gate structure in the N well region. It can again be seen that the split polysilicon process allowed both the capacitor plate, as well as the polysilicon gate structure, to be obtained in a single etch step. This structure is shown schematically in FIG. 14, after photoresist removal via O2 plasma ashing.

Figure 15:
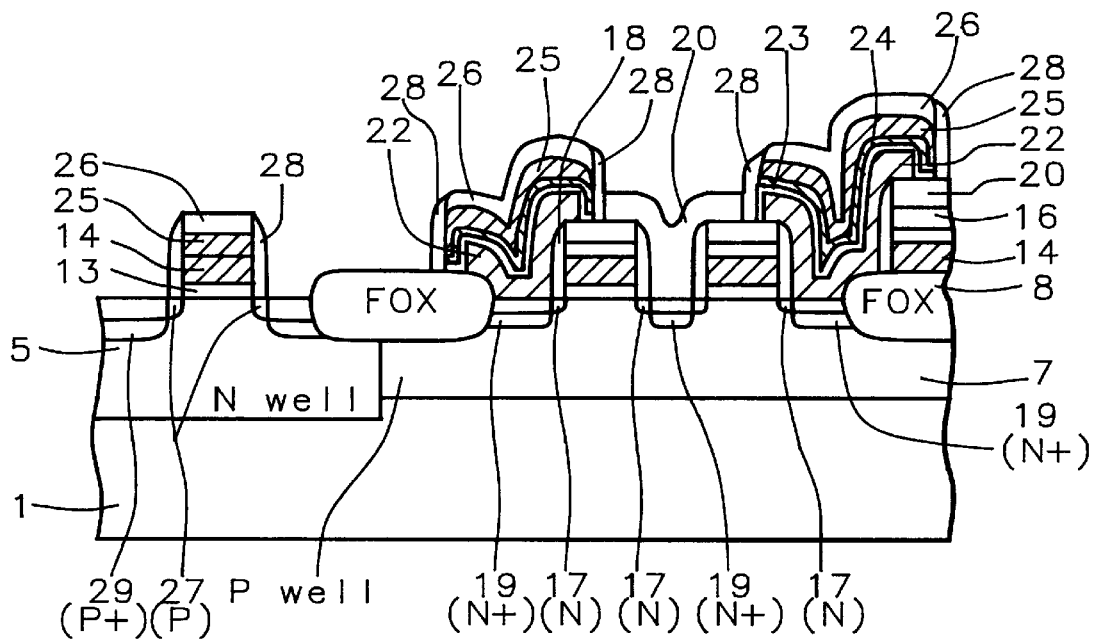
Figure 16:
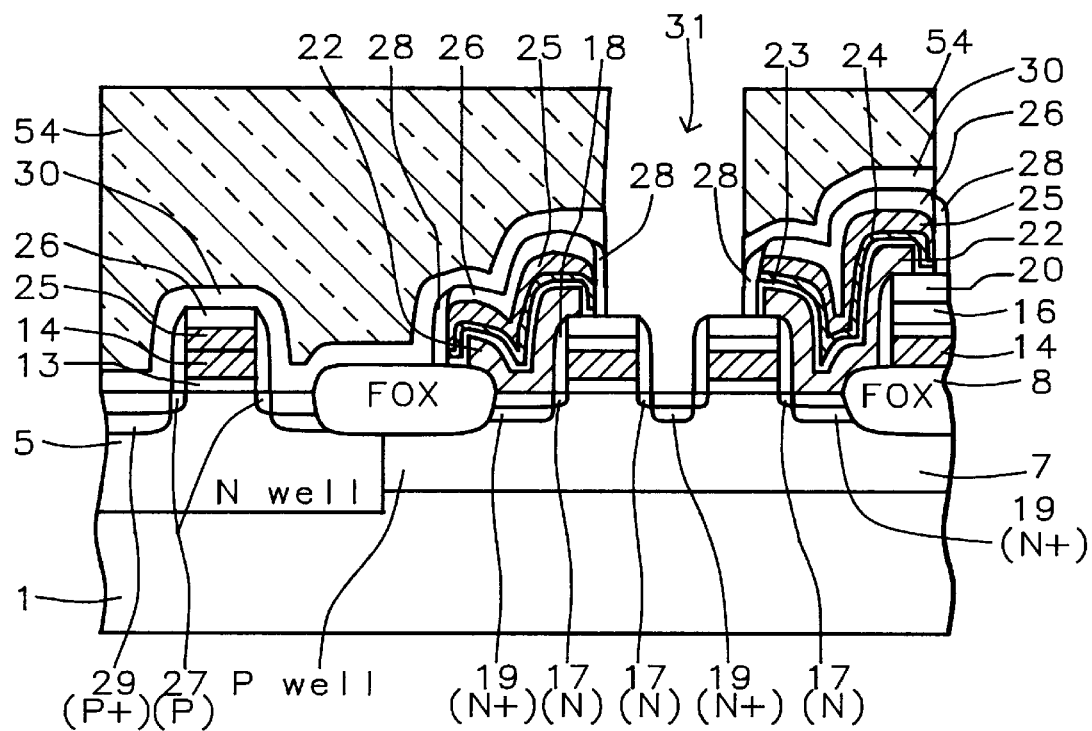
FIGS. 16–17, which schematically, in cross-sectional representations, describe the bit line contact structure process.
Figure 17:
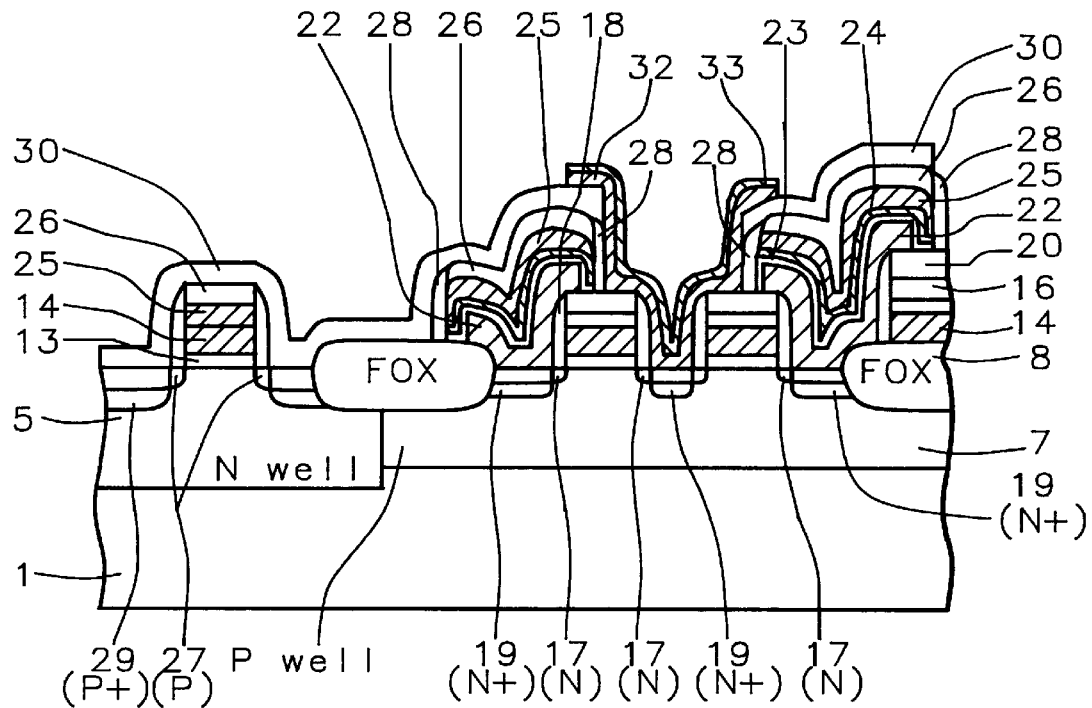

FIG. 15, illustrates the creation of the P type LDD, and source and drain areas, needed to fabricate the P channel devices, in the N well region, 5. First the LDD, 27, is formed via ion implantation of B11 or BF2 at an energy between about 30 to 50 Kev., at a dose between about 1E13 to 1E14 atoms/cm2. Next a TEOS oxide is grown to a thickness between about 1000 to 3000 Angstroms, and subjected to a anisotropic RIE process, used to create insulator spacer, 28. Next the source and drain areas, 29, are formed via ion implantation of BF2, at an energy between about 30 to 60 Kev., a dose between about 1E15 to 5E15 atoms/cm2. It should be noted that the creation of these regions were again accomplished without the use of photolithographic masking. The bit line contact hole process is next addressed by first depositing a layer of TEOS oxide, 30, to a thickness between about 5000 to 6000 Angstroms, and opening a contact hole to diffused area, 19, in the P well region, 7. The bit line contact hole, 31, is arrived at with photoresist image, 54, and RIE using CHF3 to etch TEOS layers 30, and 20. It can be seen that the photolitography is designed to allow a self-aligned bit line contact to be produced. This can be seen in FIG. 16. After photoresist removal, via O2 plasma ashing, and careful wet cleans, another layer of in-situ doped polysilicon, 32, is grown using LPCVD, at a temperature between about 525° to 570° C., to a thickness between about 500 to 1000 Angstroms. A layer of tungsten silicide, 33, is deposited, again using LPCVD, to a thickness between about 1000 to 2000 Angstroms. Standard photolithographic and RIE procedures are used to define the tungsten silicide - polysilicon, (polycide), bit contact structure, shown in FIG. 17. Photoresist removal again was accomplished using O2 plasma ashing.

Figure 18:
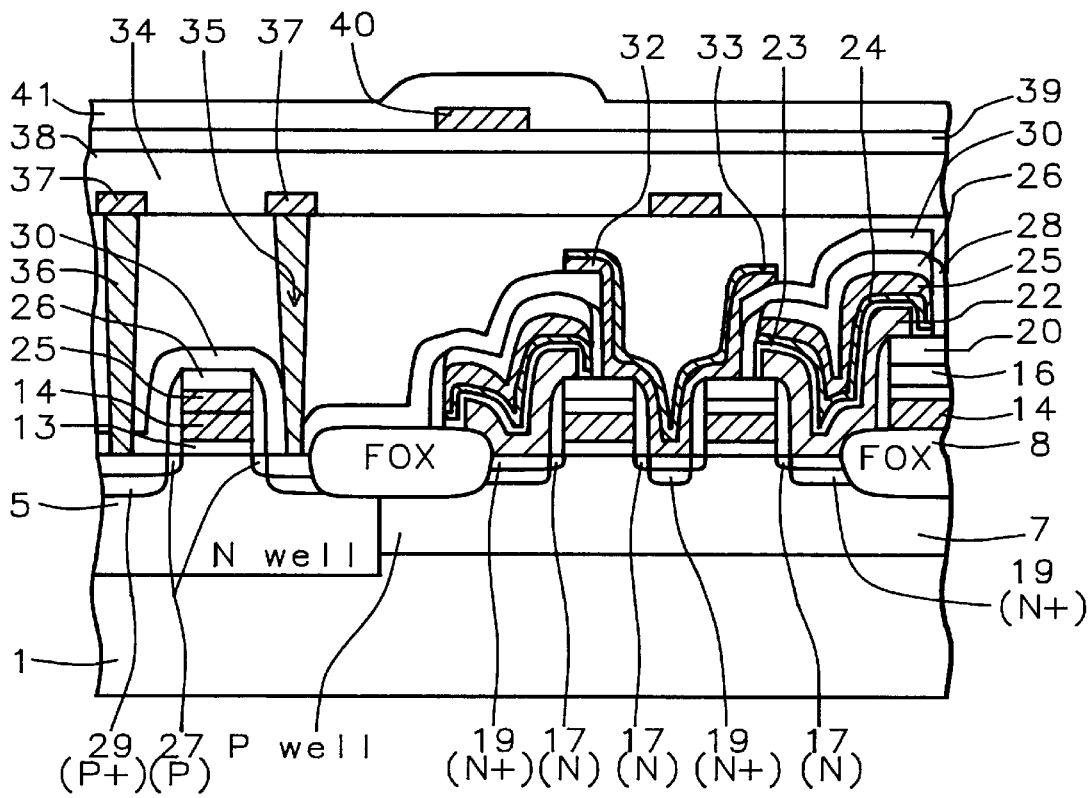
FIGS. 18–19, which schematically, in cross-sectional representation, illustrate the metallization and passivation structures used for this DRAM device.
Figure 19:
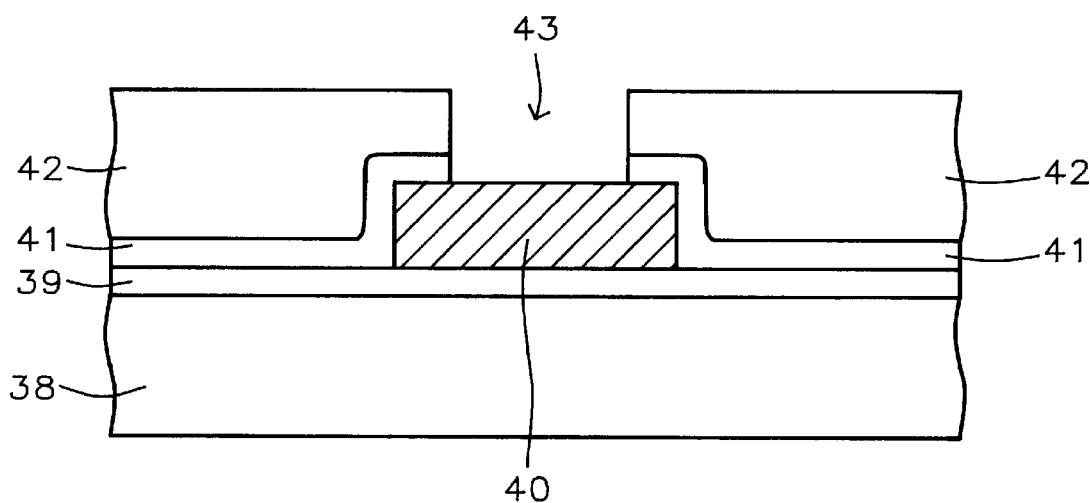

Metallization and passivation, needed to complete the stacked capacitor DRAM, are shown in FIG. 18. Briefly, a first interlevel dielectric, (ILD-1), 34, of boro-phosphosilicate glass, (BPSG), is deposited using plasma enhanced chemical vapor deposition, (PECVD), or LPCVD, to a thickness between about 4000 to 15000 Angstroms, followed by a N2 anneal at a temperature between about 800° to 900° C., Chemical -mechanical polishing, (CMP), is used to create the smooth topogology of ILD-1, necessary for subsequent planar metallization and passivation processes. A contact hole, 35, is formed in ILD-1, via standard photolithographic processes and RIE, using CHF3 to create the contact hole in ILD-1. After photoresist removal and careful wet cleans, an r.f. sputter deposition of TiN-tungsten is carried out, completely filling contact hole, 35. CMP is again used to remove unwanted TiN - tungsten from the surface of ILD-1, resulting in contact stud, 36. A deposition of Al—Cu, using standard sputtering techniques to a thickness between about 4000 to 8000 Angstroms, is next performed, and followed by conventional photolithographic and C12 RIE processing, to create the M1 structure, 37, shown in FIG. 18. A second interlevel dielectric, (ILD-2), 38, is next deposited using processing identical to processing used for ILD-1. Again CMP is employed to planarize the ILD-2 layer. A critical layer of silicon nitride, 39, is next deposited, on the planarized ILD-2 layer, using PECVD, to a thickness between about 5000 to 10000 Angstroms, creating a composite dielectric layer. The silicon nitride overlay is needed to insure against interlevel leakage and shorts that can arise between metal levers. Via hole openings in the composite, to M1, (not shown in FIG. 18), are made, again using standard photolithographic and RIE processing. A metal deposition of Al—Cu is next performed, contacting M1 in the interlevel via, (not shown in FIG. 18), and overlying composite ILD-2. Photolithographic and RIE processing then create M2 structure, 40. Finally FIG. 19 indicates the passivation of the M2 structure, 40, with a PECVD deposition of silicon oxide, 41, and a coating of polyimide, 42. Bonding pads, 43, to the M2 structure, 40, are made again using standard photolithographic and RIE processing.

While this invention has been particularly shown and described with reference to, the preferred embodiments thereof, it will be understood by those skilled in the art that various changes in form and detail may be made without departing from the spirit and scope of this invention.

What is claimed is:

1. A stacked capacitor, dynamic random access memory, (DRAM), device structure, in a P type region of a semiconductor substrate comprising:

thick field oxide regions in semiconductor substrate;

polysilicon gate structures, comprised of a top layer of phosphosilicate glass, containing between about 2 to 6 weight percent $P_2 O_5$, overlying a thin layer of silicon oxide, which overlies an N type, insitu doped polysilicon layer, and with said polysilicon gate structures, located between said thick field oxide regions;

insulator spacers located on the sides of said polysilicon structures;

N type source and drain regions, in said P type region of said semiconductor substrate, located between a thick field oxide region and a polysilicon gate structure, and an N type source and drain region located between said polysilicon gate structures;

a stacked capacitor structure, comprised of; a storage node electrode of polysilicon, a thin dielectric layer on said storage node electrode, and a capacitor plate on said thin dielectric layer, with capacitor plate comprised of a bottom layer of amorphous silicon, with a smooth top surface topography, between about 300 to 700 Angstroms in thickness, and an overlying polysilicon layer, between about 750 to 1250 Angstroms in thickness, contacting N type source and drain region, located between said thick field oxide region and said polysilicon gate structure, and with said stacked capacitor structure overlapping said thick field oxide region, and overlapping said phosphosilicate glass layer, of said polysilicon gate structure;

a bit line structure, comprised of an underlying polysilicon layer, and an overlying tungsten silicide layer, contacting N type source and drain region, located between polysilicon gate structures;

a N type region of said semiconductor substrate, separated from said P type region of said semiconductor substrate by a field oxide region, and comprised of a polysilicon gate structure, and P type source and drain regions; and a two part metal contact structure, comprised of wide, top layer of aluminum - copper, overlying a narrower tungsten stud, with the tungsten contact stud contacting said P type source and drain region, of said N type region of said semiconductor substrate.

* * * * *